United States Patent
Tu et al.

(10) Patent No.: US 12,218,186 B2
(45) Date of Patent: Feb. 4, 2025

(54) BACK-END-OF-LINE PASSIVE DEVICE STRUCTURE HAVING COMMON CONNECTION TO GROUND

(71) Applicant: Taiwan Semiconductor Manufacturing Company, Ltd., Hsinchu (TW)

(72) Inventors: Wen-Chiung Tu, Hsinchu (TW); Hsiang-Ku Shen, Hsinchu (TW); Yuan-Yang Hsiao, Hsinchu (TW); Tsung-Chieh Hsiao, Changhua County (TW); Chen-Chiu Huang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 375 days.

(21) Appl. No.: 17/666,285

(22) Filed: Feb. 7, 2022

(65) Prior Publication Data
US 2023/0187479 A1    Jun. 15, 2023

Related U.S. Application Data

(60) Provisional application No. 63/289,457, filed on Dec. 14, 2021.

(51) Int. Cl.
*H01L 23/522*      (2006.01)
*H01L 27/06*       (2006.01)
*H01L 49/02*       (2006.01)

(52) U.S. Cl.
CPC .......... *H01L 28/91* (2013.01); *H01L 23/5223* (2013.01); *H01L 23/5226* (2013.01); *H01L 27/0688* (2013.01)

(58) Field of Classification Search
CPC . H01L 28/91; H01L 23/5223; H01L 23/5226; H01L 27/0688
(Continued)

(56) References Cited

U.S. PATENT DOCUMENTS 11,114,373 B1    9/2021   Hsiao et al.
11,145,592 B2    10/2021  Shen et al.
(Continued)

OTHER PUBLICATIONS

Tsung-Chieh Hsiao, "Back-End-of-Line Passive Device Structure," U.S. Appl. No. 17/586,287, filed Jan. 27, 2022, Assignee: Taiwan Semiconductor Manufacturing Company, Ltd., 32 pages specification, 14 pages drawings.

*Primary Examiner* — Tu-Tu V Ho
(74) *Attorney, Agent, or Firm* — HAYNES AND BOONE, LLP (57) ABSTRACT

A device structure according to the present disclosure includes a metal-insulator-metal (MIM) stack that includes a plurality of conductor plate layers interleaved by a plurality of insulator layers. The MIM stack includes a first region and a second region and the first region and the second region overlaps in a third region. The MIM stack further includes a first via passing through the first region and electrically coupled to a first subset of the plurality of conductor plate layers, a second via passing through the second region and electrically coupled to a second subset of the plurality of conductor plate layers, and a ground via passing through the third region and electrically coupled to a third subset of the plurality of conductor plate layers.

20 Claims, 8 Drawing Sheets

(58) Field of Classification Search
USPC .......................................................... 257/532
See application file for complete search history.

(56) References Cited

U.S. PATENT DOCUMENTS

| | | |
|---|---|---|
| 2006/0164876 A1 | 7/2006 | Barth et al. |
| 2020/0006183 A1 | 1/2020 | Huang et al. |
| 2020/0211955 A1* | 7/2020 | Rubin ............... H01L 21/76877 |
| 2021/0098399 A1 | 4/2021 | Huang et al. |
| 2021/0376058 A1 | 12/2021 | Shen et al. |

* cited by examiner

BACK-END-OF-LINE PASSIVE DEVICE STRUCTURE HAVING COMMON CONNECTION TO GROUND

PRIORITY DATA

The present application claims the benefit of U.S. Provisional Application No. 63/289,457, filed Dec. 14, 2021, the entirety of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plate layers that are insulated from one another by multiple insulator layers. In some instances, more than one MIM capacitor may be fabricated to serve different functions. Although existing MIM structures are generally adequate for their intended purposes, they are not satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes a plurality of conductor plate layers, each of which is insulated from an adjacent conductor plate layer by an insulator layer. As an MIM capacitor is fabricated in a BEOL structure to have a larger surface area, its conductor plate layers extend over multiple underlying top metal contact features that are connected to logic or control circuitry.

Designing and fabrication of MIM capacitors are not without challenges. Front-end-of-line (FEOL) active devices, such as transistors may serve different functions and operate at different voltages. For example, some of the transistors may function as logic gates in logic/core circuits and some other transistors may function as input/output (I/O) transistors. Logic/core transistors may operate at an operating voltage between about 0.5 volts and about 1.5 volts while I/O transistors may operate at an operating voltage between about 1.8 volts and about 4.0 volts. Despite their different functions and operating voltages, circuit design may require them to be coupled to MIM capacitors at the BEOL level. In some existing technologies, the MIM structures at the BEOL level may include a logic MIM capacitor and a separate I/O MIM capacitor, each of which may have a high voltage node coupled to a high voltage contact via and a low voltage node coupled to the ground contact via. The logic MIM capacitor and the I/O MIM capacitor are separate in the sense that none of the conductor plate layers is shared between the logic MIM capacitor and I/O capacitor. In these technologies, the logic MIM capacitor and the I/O MIM capacitor have substantially separate structures and different ground contact vias. While generally functioning properly, separate logic MIM capacitors reduce circuit design flexibility and increase MIM structure footprint.

The present disclosure provides an integrated MIM structure that includes a low voltage region and a high voltage region. In terms of applications, the low voltage region may be coupled to a logic transistor at the FEOL level and may be alternatively referred to as logic MIM region or a first region. The high voltage region may be coupled to an I/O transistor at the FEOL level and may be alternatively referred to as I/O MIM region or a second region. The first region and the second region overlap at a third region. The integrated MIM structure includes at least three conductor plate layers interleaved by isolation layers. A first via passes through the first region and is electrically coupled to a first subset of the at least three conductor plate layers. A second via passes through the second region and is electrically coupled to a second subset of the at least three conductor plate layers. A ground via passes through the third region and is electrically coupled to a third subset of the at least three conductor plate layers. At least one of the first subset is capacitively coupled to at least one of the third subset. At least one of the second subset is capacitively coupled to at least one of the third subset. That is, the logic MIM region and the I/O MIM region may share the same ground via. The integrated MIM structure has a smaller footprint and increase circuit design flexibility.

Figure 1:
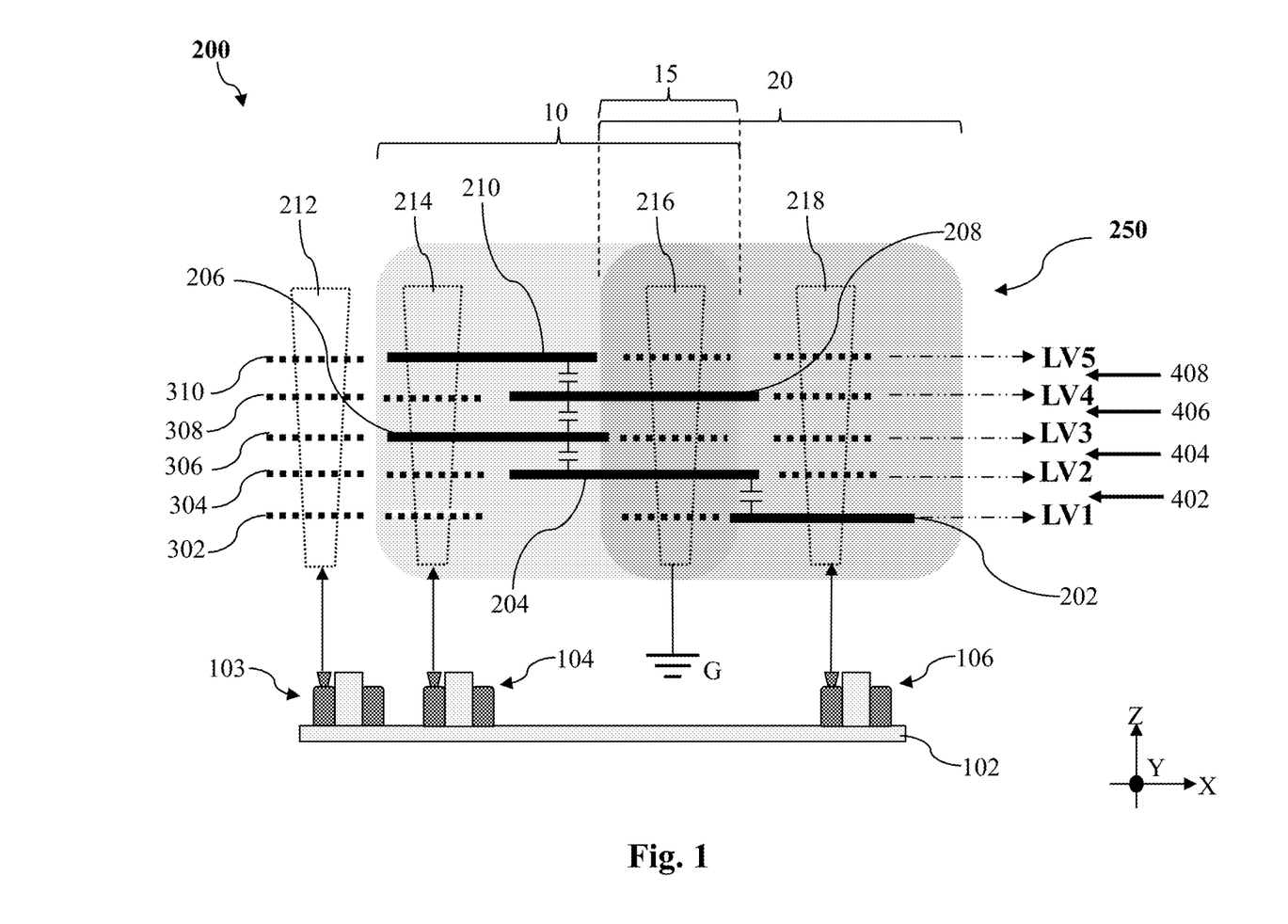
FIG. 1 is a schematic cross-sectional view of a device structure that includes two metal-insulator-metal (MIM) capacitors sharing a common ground via, according to various aspects of the present disclosure.

FIG. 1 illustrates a schematic cross-sectional view of a device structure 200 that includes an integrated MIM structure 250. The device structure 200 includes FEOL structures fabricated on a substrate 102 and the integrated MIM structure 250 at the BEOL level. It is noted that an interconnect structure and a redistribution layer (RDL), both of which are not shown in FIG. 1 for simplicity, may be disposed between the substrate 102 and the integrated MIM structure 250 to provide signal routing. The substrate 102 may include a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-VI materials; or combinations thereof. Alternatively, the substrate 102 is a semiconductor-on-insulator substrate, such as a silicon-on-insulator (SOI) substrate or a germanium-on-insulator (GeOI) substrate. In some embodiments, the substrate 102 may include an epitaxial layer, for example an epitaxial layer overlying a bulk semiconductor.

The FEOL structures may include a plurality of transistors disposed on the substrate 102. In some embodiments illustrated in FIG. 1, the plurality of transistors may include a first logic transistor 103, a second logic transistor 104, and an I/O transistor 106. As their names suggest, the first logic transistor 103 and the second logic transistor 104 may be part of one or more logic gates and the I/O transistor 106 may control connection to a supply voltage. In some embodiments, the first logic transistor 103, the second logic transistor 104, and the I/O transistor 106 may be the same type of transistors, such as multi-bridge-channel (MBC) transistors or fin-type field effect transistors (FinFETs). A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. In these embodiments, the I/O transistor 106 may be different from the first logic transistor 103 and the second logic transistor 104 in terms of thicknesses of gate dielectric layers or gate length. For example, the first logic transistor 103 and the second logic transistor 104 may be MBC transistors of a first gate dielectric layer thickness and the I/O transistor 106 may be an MBC transistor of a second gate dielectric layer thickness greater than the first gate dielectric layer thickness. For another example, the I/O transistor 106 may have a gate length greater than that of the first logic transistor 103 and the second logic transistor 104. In some other embodiments, the first logic transistor 103 and the second logic transistor 104 may be of a different type than the I/O transistor 106. For example, because FinFETs may be more suitable for high voltage operations, the first logic transistor 103 and the second logic transistor 104 may be MBC transistors while the I/O transistor 106 may be a FinFET.

The integrated MIM structure 250 may include a plurality of conductor plate layers interleaved by a plurality of insulator layers. In order for embodiments of the present disclosure to work properly, the integrated MIM structure 250 includes at least three conductor plate layers. In the depicted embodiments, the integrated MIM structure 250 includes five levels—a first level (LV1), a second level (LV2) over the first level, a third level (LV3) over the second level, a fourth level (LV4) over the third level, and a fifth level (LV5) over the fourth level. It is understood that the integrated MIM structure 250 may include more levels to meet design needs. The first level (LV1) includes a first conductor plate layer 202 and first dummy pads 302. The second level (LV2) includes a second conductor plate layer 204 and second dummy pads 304. The third level (LV3) includes a third conductor plate layer 206 and third dummy pads 306. The fourth level (LV4) includes a fourth conductor plate layer 208 and fourth dummy pads 308. The fifth level (LV5) includes a fifth conductor plate layer 210 and fifth dummy pads 310. The first conductor plate layer 202 and the first dummy pads 302 in the first level (LV1) are insulated from the second conductor plate layer 204 and the second dummy pads 304 in the second level (LV2) by a first insulator layer 402. The second conductor plate layer 204 and the second dummy pads 304 in the second level (LV2) are insulated from the third conductor plate layer 206 and the third dummy pads 306 in the third level (LV3) by a second insulator layer 404. The third conductor plate layer 206 and the third dummy pads 306 in the third level (LV3) are insulated from the fourth conductor plate layer 208 and the fourth dummy pads 308 in the fourth level (LV4) by a third insulator layer 406. The fourth conductor plate layer 208 and the fourth dummy pads 308 in the fourth level (LV4) are insulated from the fifth conductor plate layer 210 and the fifth dummy pads 310 in the fifth level (LV5) by a fourth insulator layer 408.

The first conductor plate layer 202, the first dummy pads 302, the second conductor plate layer 204, the second dummy pads 304, the third conductor plate layer 206, the third dummy pads 306, the fourth conductor plate layer 208, the fourth dummy pads 308, the fifth conductor plate layer 210, and the fifth dummy pads 310 may include titanium nitride (TiN), tantalum nitride (TaN), titanium (Ti), tantalum (Ta), cobalt (Co), nickel (Ni), copper (Cu), or a combination thereof. In one embodiment, they are formed of titanium nitride (TiN). The first insulator layer 402, the second insulator layer 404, the third insulator layer 406, and the fourth insulator layer 408 may include a high-k dielectric material, such as hafnium oxide, hafnium aluminum oxide, hafnium zirconium oxide, zirconium oxide, zirconium aluminum oxide, aluminum oxide, or a combination thereof.

The dummy pads illustrated in FIG. 1 are for illustration purposes only and not all illustrated dummy pads are needed for the device structure 200 to function properly. As used herein, a dummy pad is a electrically floating conductor layer that is electrically insulated from any of the conductor plate layers level by insulation layers. A dummy pad is formed along with the conductor plate layer at the same level. For that reason, it shares the same composition and thickness of the conductor plate layer at the same level. As their name suggest, the dummy pads do not serve any circuit or electrical connection functions. They are inserted to balance out etch loading. As will be described below, a number of contact vias may be formed through different regions of the integrated MIM structure 250. Each of the contact via is formed in a contact via opening that extends through different numbers of conductor plate layers. The dummy pads are inserted such that all of the contact via openings are etched through the same number of metal layers.

The integrated MIM structure 250 may include a first region 10 and a second region 20. In some embodiments represented in FIG. 1, the first region 10 and the second region 20 overlap at a third region 15. FIG. 1 illustrates four contact vias—a first contact via 212, a second contact via 214, a third contact via 216, and a fourth contact via 218. The first contact via 212 is not electrically coupled to any of the conductor plate layers in the integrated MIM structure 250. As shown in FIG. 1, the first contact via 212 extends vertically (along the Z direction) through a first dummy pad 302, a second dummy pad 304, a third dummy pad 306, a fourth dummy pad 308, and a fifth dummy pad 310. As described above, each of these dummy pads is electrically insulated from the conductor plate layer at the same level.

The first contact via 212 is insulated from any of the first conductor plate layer 202, the second conductor plate layer 204, the third conductor plate layer 206, the fourth conductor plate layer 208, and the fifth conductor plate layer 210. In other words, the first contact via 212 physically passes through the integrated MIM structure 250 without being electrically coupled to any of the conductor plate layers therein. Through the interconnect structure and RDL, the first contact via 212 is coupled to a source/drain of the first logic transistor 103 that is not connected to an MIM capacitor by design.

Referring still to FIG. 1, the second contact via 214 extends through the first region 10 and is electrically coupled to a first subset of the conductor plate layers. In the depicted embodiment, the first subset includes the third conductor plate layer 206 and the fifth conductor plate layer 210. To balance the etch loading, the second contact via 214 additionally extends through three dummy pads—a first dummy pad 302, a second dummy pad 304, and a fourth dummy pad 308. A fourth contact via 218 extends through the second region 20 and is electrically coupled to a second subset of conductor plate layers. In the depicted embodiment, the second subset includes the first conductor plate layer 202. To balance the etch loading, the fourth contact via 218 also extends through 4 dummy pads—a second dummy pad 304, a third dummy pad 306, a fourth dummy pad 308, and a fifth dummy pad 310. A third contact via 216 extends through the third region 15 and is electrically coupled to a third subset of the conductor plate layers. In the depicted embodiment, the third subset includes the second conductor plate layer 204 and the fourth conductor plate layer 208. To balance the etch loading, the third contact via 216 also extends through three dummy pads—a first dummy pad 302, a third dummy pad 306, and a fifth dummy pad 310. As described above, the insertion of the dummy pads is aimed to balance etch loading. In some instances, the numbers of dummy pads that are penetrated by each of the contact vias may be reduced one or three and the number of metal layers etched through to form the via openings may still remain identical. For example, if the numbers of the dummy pads that are penetrated by each of the contact via are reduced by two, formation of the contact via openings will require etching through three metal layers, such as three dummy pads, two conductor plate layers plus one dummy pad, or one conductor plate layer plus two dummy pads.

The first subset of the conductor plate layers is capacitively coupled to at least one of the third subset of conductor plate layer. In the depicted embodiment, due to vertical areal overlapping, the fifth conductor plate layer 210 (in the first subset) is capacitively coupled to the fourth conductor plate layer 208 (in the third subset). The third conductor plate layer 206 (in the first subset) is capacitively coupled to the fourth conductor plate layer 208 (in the third subset) and the second conductor plate layer 204 (in the third subset). Through the interconnect structure and the RDL, the second contact via 214 is electrically coupled to a source/drain of the second logic transistor 104 and the third contact via 216 is electrically coupled to a ground voltage (G). This way, the first region 10 functions as a logic MIM capacitor, with the second contact via 214 serving as a high voltage contact via and the third contact via 216 serving as a ground via. The capacitance between the second contact via 214 and the third contact via 216 is defined by the capacitance between the first subset and the third subset of the conductor plate layers.

The second subset of the conductor plate layers is capacitively coupled to at least one of the third subset of conductor plate layer. In the depicted embodiment, due to vertical areal overlapping, the first conductor plate layer 202 (in the second subset) is capacitively coupled to the second conductor plate layer 204 (in the third subset). Through the interconnect structure and the RDL, the fourth contact via 218 is electrically coupled to a source/drain of the I/O transistor 106 and the third contact via 216 is electrically coupled to a ground voltage (G). This way, the second region 20 functions as a logic MIM capacitor, with the fourth contact via 218 serving as a high voltage contact via and the third contact via 216 serving as a ground via. The capacitance between the fourth contact via 218 and the third contact via 216 is defined by the capacitance between the second subset and the third subset of the conductor plate layers. It is noted that while each of the first subset and the second subset is capacitively coupled to the third subset as described above, the first subset is different from the second subset or the third subset. The second subset is different from the third subset. It can be seen that at least three conductor plate layers are needed in order to have three distinctive subsets.

With the second contact via 214 coupled to the second logic transistor 104, the first region 10 functions as a logic MIM region 10 or a logic MIM capacitor 10. With the fourth contact via 218 coupled to the I/O transistor 106, the second region 20 functions as an I/O MIM region 20 or an I/O MIM capacitor 20. The logic MIM capacitor 10 and the I/O MIM capacitor 20 share the same ground via 216. Although the logic MIM capacitor 10 and the I/O MIM capacitor 20 share the same ground voltage, they may have different operating voltages. For example, the logic MIM capacitor 10 may have an operating voltage between about 0.5 volts and about 1.0 volts and the I/O MIM capacitor 20 may have an operating voltage between about 1.8 volts and about 4.0 volts. A capacitance of the logic MIM capacitor 10 is different from a capacitance of the I/O MIM capacitor 20.

In order to accommodate different operating voltages, the first insulation layer 402 that affects the capacitance of the I/O MIM capacitor 20 may be different from the insulation layers 404, 406 and 408 that affect the capacitance of the logic MIM capacitor 10 in terms of material and thickness. Generally speaking, the I/O MIM capacitor 20 operates at a higher voltage that requires either a greater thickness or a material of higher dielectric constant. In some embodiments, a thickness of the first insulation layer 402 may be about 2-4 times of a thickness of each of the second insulation layer 404, the third insulation layer 406, and the fourth insulation layer 408. In some other embodiments, a dielectric constant of the first insulation layer 402 may be greater than a dielectric constant of the other insulation layers. In one example, the first insulation layer 402 includes hafnium oxide while the other insulation layers (i.e., 404, 406, and 408) include aluminum oxide or hafnium aluminum oxide. In another example, the first insulation layer 402 includes hafnium zirconium oxide or zirconium oxide while the other insulation layers (i.e., 404, 406, and 408) include hafnium oxide or hafnium aluminum oxide.

Figure 2:
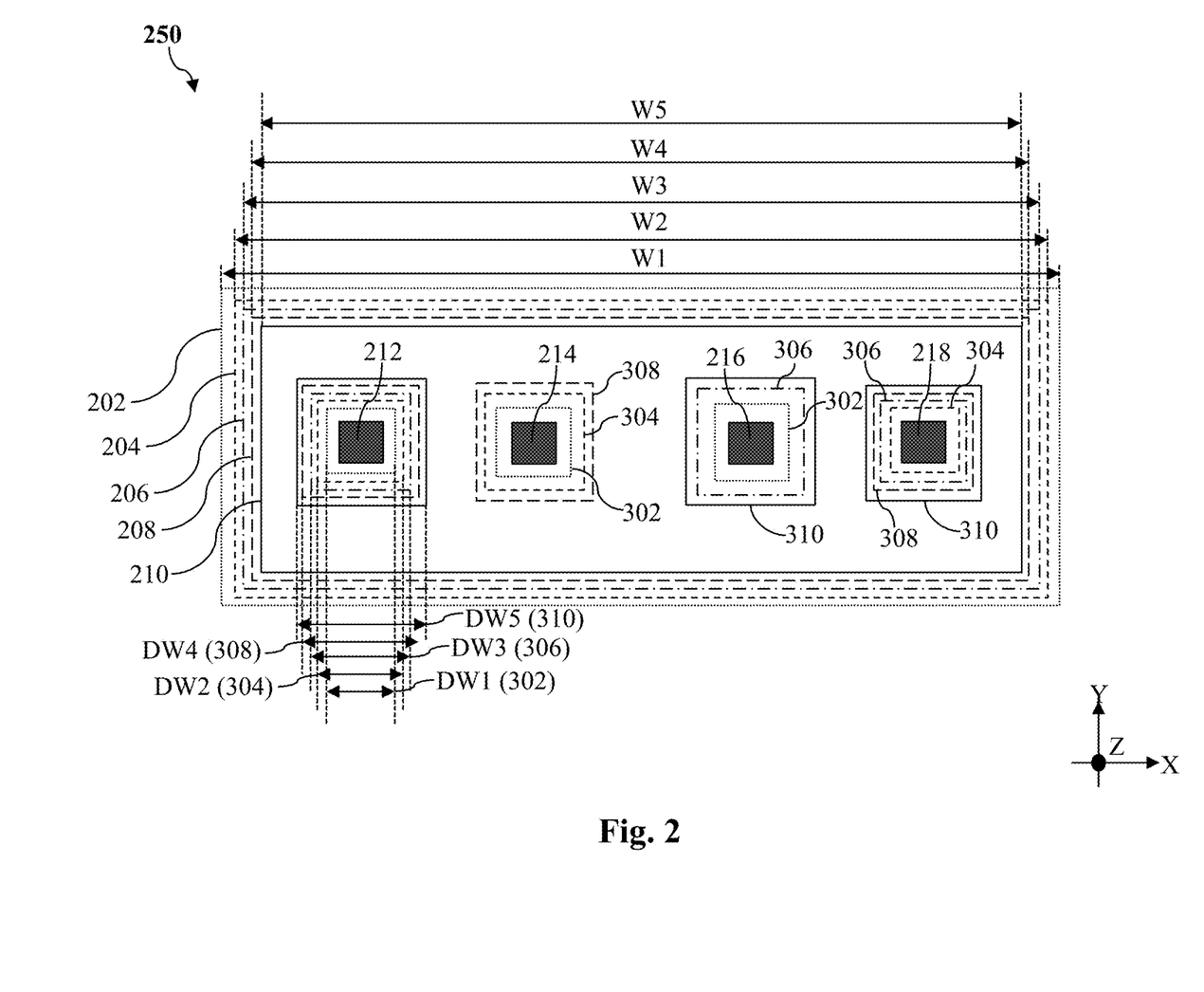
FIGS. 2-4 are schematic top views of the device structure in FIG. 1, according to various aspects of the present disclosure.
Figure 3:
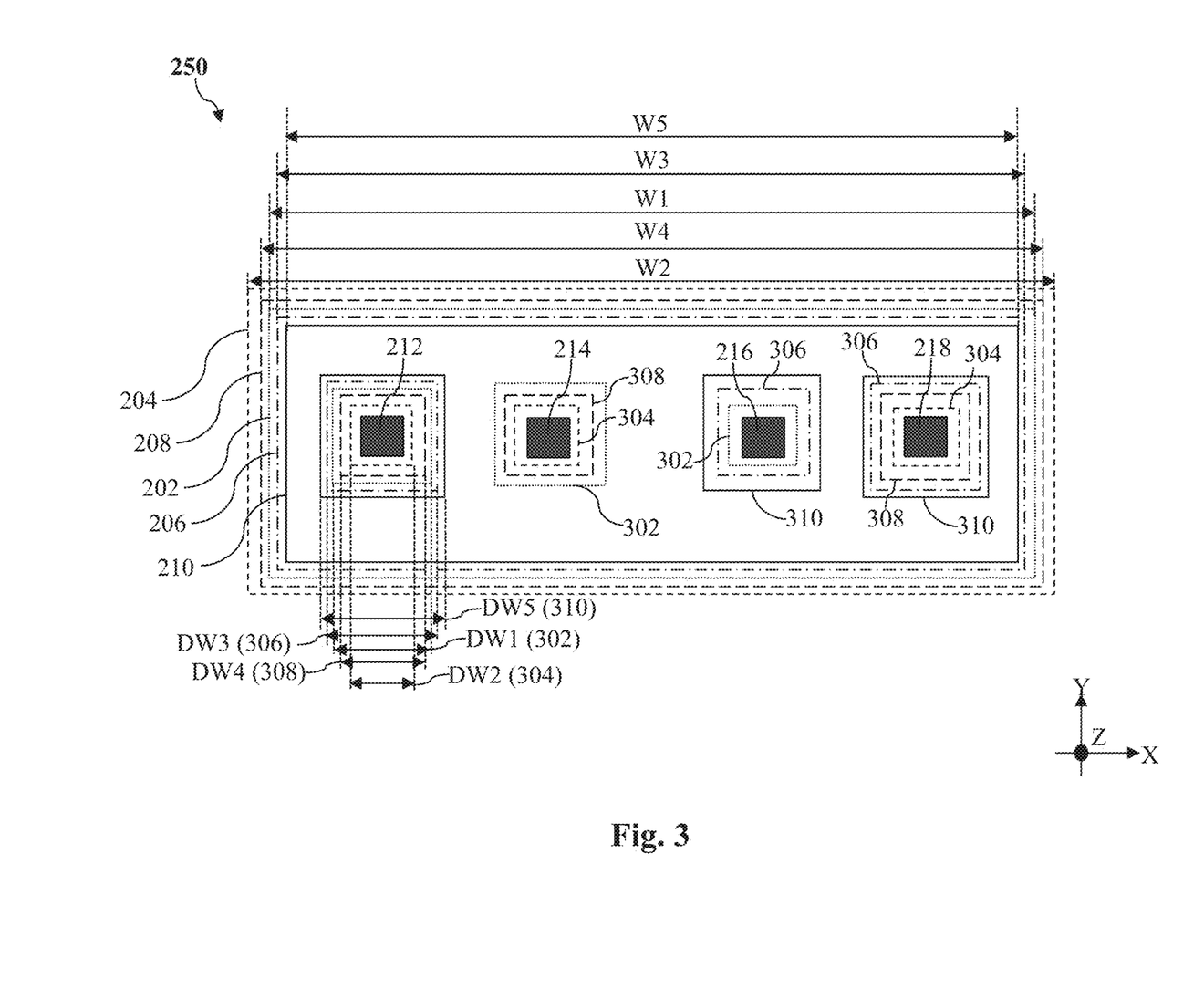
Figure 4:
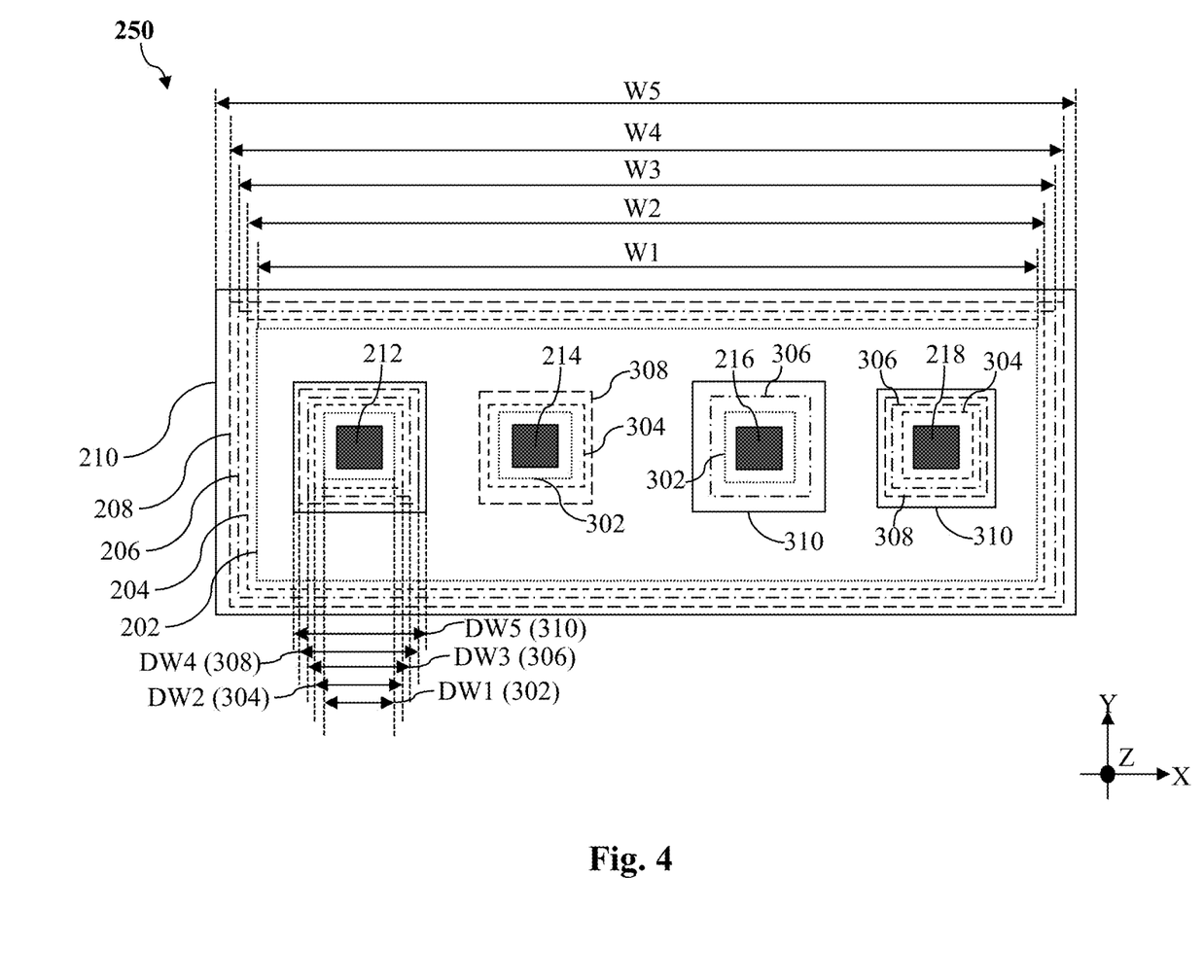

The plurality of the conductor plate layers in FIG. 1 may be stacked according to different conventions. FIGS. 2-4 illustrate schematic top views of the integrated MIM structure 250 shown in FIG. 1. FIG. 2 illustrates embodiments where the conductor plate layers are stacked according to a wide-bottom-narrow-top (BT) convention. FIG. 3 illustrates embodiments where the conductor plate layers are stacked according to an even-number-plate-enclosure (EE) convention. FIG. 4 illustrates embodiments where the conductor plate layers are stacked according to an wide-top-narrow-bottom (TB) convention. To avoid multiplicity of reference numerals, a first dummy pad 302 refers to dummy pad in the first level LV1 (shown in FIG. 1), a second dummy pad 304 refers to dummy pad in the second level LV2 (shown in FIG. 1), a third dummy pad 306 refers to dummy pad in the third level LV3 (shown in FIG. 1), a fourth dummy pad 308 refers to dummy pad in the fourth level LV4 (shown in FIG. 1), a fifth dummy pad 310 refers to dummy pad in the fifth level LV5 (shown in FIG. 1). Although the various contact vias may extend through different dummy pads in the same level, those dummy pads may not be separately named. For example, the first contact via 212 extends through a first dummy pad 302 and the second contact via 214 also extends through a first dummy pad 302. Although these two first dummy pads 302 are separate and different, they may be referred to as a first dummy pad 302 with respect to each of the contact via. None of the illustrated embodiments includes a dummy pad that is extended through by more than one contact via.

Referring to FIG. 2, along the X-Y plane, the first conductor plate layer 202 is larger than the second conductor plate layer 204, the second conductor plate layer 204 is larger than the third conductor plate layer 206, the third conductor plate layer 206 is larger than the fourth conductor plate layer 208, and the fourth conductor plate layer 208 is greater than the fifth conductor plate layer 210. Widths along the X direction may serve as proxies of the areas along the X-Y plane. As shown in FIG. 2, a first width W1 of the first conductor plate layer 202 is greater than a second width W2 of the second conductor plate layer 204, a second width W2 of the second conductor plate layer 204 is greater than a third width W3 of the third conductor plate layer 206, a third width W3 of the third conductor plate layer 206 is greater than a fourth width W4 of the fourth conductor plate layer 208, and a fourth width W4 of the fourth conductor plate layer 208 is greater than a fifth width W5 of the fifth conductor plate layer 210. In some embodiment represented in FIG. 2, the BT convention in the conductor plate layers may result in a TB convention for the dummy pads due to the minimum spacing requirement between an inner edge of an opening and an outer edge of the dummy pad. The largest first width W1 of a first dummy pad 302 comes hand in hand with the smallest first dummy width DW1. The smallest fifth width W5 of a fifth conductor plate layer 210 is accompanied by the largest fifth dummy width DW5. It follows that a fourth dummy width DW4 of a fourth dummy pad 308 is greater than a third dummy width DW3 of a third dummy pad 306 and the third dummy width DW3 is greater than a second dummy width DW2 of a second dummy pad 304.

Referring to FIG. 2, the second contact via 214 vertically extends through the fifth conductor plate layer 210, a fourth dummy pad 308, the third conductor plate layer 206, a second dummy pad 304, and a first dummy pad 302. The fourth dummy pad 308 is larger than the second dummy pad 304 and the second dummy pad 304 is larger than the first dummy pad 302. The third contact via 216 vertically extends through a fifth dummy pad 310, the fourth conductor plate layer 208, a third dummy pad 306, the second conductor plate layer 204, and a first dummy pad 302. The fifth dummy pad 310 is larger than the third dummy pad 306 and the third dummy pad 306 is larger than the first dummy pad 302. The fourth contact via 218 vertically extends through a fifth dummy pad 310, a fourth dummy pad 308, a third dummy pad 306, a second dummy pad 304, and the first conductor plate layer 202. The fifth dummy pad 310 is larger than the fourth dummy pad 308, the fourth dummy pad 308 is larger than the third dummy pad 306, and the third dummy pad 306 is larger than the second dummy pad 304.

FIG. 3 illustrates embodiments where the conductor plate layers are stacked according to an even-number-plate-enclosure (EE) convention. As shown therein, along the X-Y plane, the second conductor plate layer 204 is larger than and encloses the first conductor plate layer 202 and the fourth conductor plate layer 208 is larger than and encloses the third the fourth conductor plate layer 208. The third conductor plate layer 206 is also smaller than the fourth conductor plate layer 208. Out of the odd-numbered conductor plate layers, the first conductor plate layer 202 is the largest and the fifth conductor plate layer 210 is the smallest. Widths along the X direction may serve as proxies of the areas along the X-Y plane. As shown in FIG. 3, the second width W2 of the second conductor plate layer 204 is greater than the fourth width W4 of the fourth conductor plate layer 208, the fourth width W4 is greater than the first width W1 of the first conductor plate layer 202, the first width W1 is greater than the third width W3 of the third conductor plate layer 206, and the third width W3 is greater than a fifth width W5 of the fifth conductor plate layer 210. In some embodiment represented in FIG. 3, the EE convention in the conductor plate layers may result in an odd-number-pad-enclosure convention for the dummy pads due to the minimum spacing requirement between an inner edge of an opening and an outer edge of the dummy pad. The largest second width W2 of the second conductor plate layer 204 comes hand in hand with the smallest second dummy width DW2. The smallest fifth width W5 of a fifth conductor plate layer 210 is accompanied by the largest fifth dummy width DW5. It can be seen that the fifth dummy pad 310 is larger than and encloses the fourth dummy pad 308 and the third dummy pad 306 is larger than and encloses the second dummy pad 304.

Referring to FIG. 3, the second contact via 214 vertically extends through the fifth conductor plate layer 210, a fourth dummy pad 308, the third conductor plate layer 206, a second dummy pad 304, and a first dummy pad 302. The first dummy pad 302 is larger than the fourth dummy pad 308 and the fourth dummy pad 308 is larger than the second dummy pad 304. The third contact via 216 vertically extends through a fifth dummy pad 310, the fourth conductor plate layer 208, a third dummy pad 306, the second conductor plate layer 204, and a first dummy pad 302. The fifth dummy pad 310 is larger than the third dummy pad 306 and the third dummy pad 306 is larger than the first dummy pad 302. The fourth contact via 218 vertically extends through a fifth dummy pad 310, a fourth dummy pad 308, a third dummy pad 306, a second dummy pad 304, and the first conductor plate layer 202. The fifth dummy pad 310 is larger than the fourth dummy pad 308 and the third dummy pad 306 is larger than the second dummy pad 304.

FIG. 4 illustrates embodiments where the conductor plate layers are stacked according to an wide-top-narrow-bottom (TB) convention. As shown in FIG. 4, along the X-Y plane, the fifth conductor plate layer 210 is larger than the fourth conductor plate layer 208, the fourth conductor plate layer 208 is larger than the third conductor plate layer 206, the third conductor plate layer 206 is larger than the second conductor plate layer 204, and the second conductor plate layer 204 is greater than the first conductor plate layer 202. Widths along the X direction may serve as proxies of the areas along the X-Y plane. As shown in FIG. 4, a fifth width W5 of the fifth conductor plate layer 210 is greater than a fourth width W4 of the fourth conductor plate layer 208, the fourth width W4 is greater than a third width W3 of the third conductor plate layer 206, the third width W3 is greater than a second width W2 of the second conductor plate layer 204, and the second width W2 is greater than a first width W1 of the first conductor plate layer 202. In some embodiment represented in FIG. 4, the TB convention in the conductor plate layers may result in a TB convention for the dummy pads due to the cascade shape. The largest fifth width W5 comes hand in hand with the largest fifth dummy width DW5. The smallest first width W1 is accompanied by the smallest first dummy width DW1. It follows that a fourth dummy width DW4 of a fourth dummy pad 308 is greater than a third dummy width DW3 of a third dummy pad 306 and the third dummy width DW3 is greater than a second dummy width DW2 of a second dummy pad 304.

Referring to FIG. 4, the second contact via 214 vertically extends through the fifth conductor plate layer 210, a fourth dummy pad 308, the third conductor plate layer 206, the second dummy pad 304, and the first dummy pad 302. The fourth dummy pad 308 is larger than the second dummy pad 304 and the second dummy pad 304 is larger than the first dummy pad 302. The third contact via 216 vertically extends through a fifth dummy pad 310, the fourth conductor plate layer 208, a third dummy pad 306, the second conductor plate layer 204, and the first dummy pad 302. The fifth dummy pad 310 is larger than the third dummy pad 306 and the third dummy pad 306 is larger than the first dummy pad 302. The fourth contact via 218 vertically extends through a fifth dummy pad 310, a fourth dummy pad 308, a third dummy pad 306, a second dummy pad 304, and the first conductor plate layer 202. The fifth dummy pad 310 is larger than the fourth dummy pad 308, the fourth dummy pad 308 is larger than the third dummy pad 306, and the third dummy pad 306 is larger than the second dummy pad 304.

Figure 5:
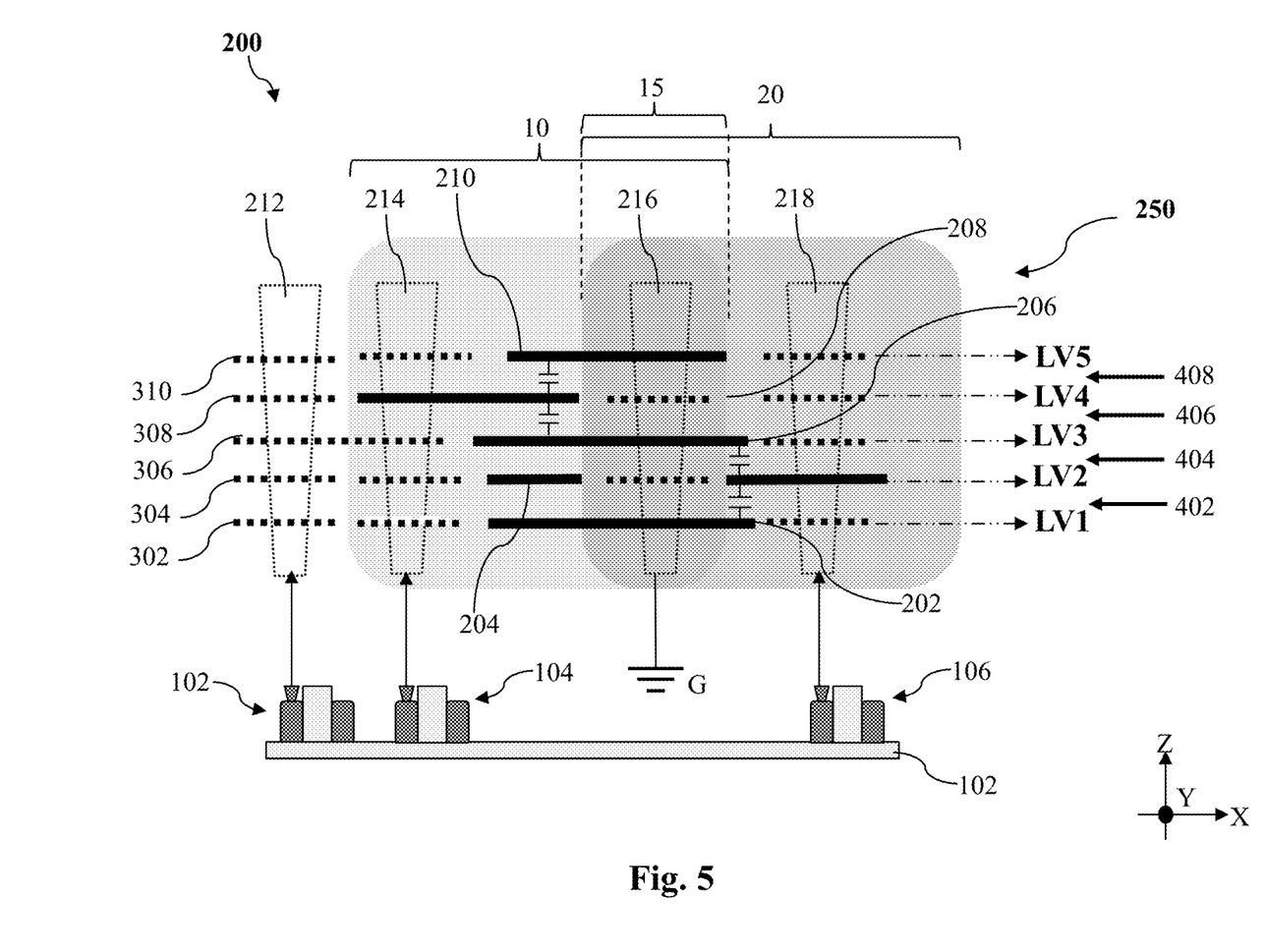
FIG. 5 is a schematic cross-sectional view of a device structure that includes two metal-insulator-metal (MIM) capacitors sharing a common ground via, according to various aspects of the present disclosure.

In some alternative embodiments, the integrated MIM structure 250 may have a different conductor plate layer arrangement such that the I/O MIM capacitor 20 has a different capacitance. FIG. 5 illustrates a schematic cross-sectional view of a device structure 200 similar to the one shown in FIG. 1. One of the differences is that the I/O MIM capacitor 20 in FIG. 5 has a larger capacitance. Throughout the present disclosure, like reference numerals denote like features with similar compositions. For that reason, features in the integrated MIM structure 250 in FIG. 5 that are already described in conjunction with FIG. 1 above may not be described in detail.

The integrated MIM structure 250 in FIG. 5 also include five levels—a first level (LV1), a second level (LV2) over the first level, a third level (LV3) over the second level, a fourth level (LV4) over the third level, and a fifth level (LV5) over the fourth level. The first level (LV1) includes a first conductor plate layer 202 and first dummy pads 302. The second level (LV2) includes a second conductor plate layer 204 and second dummy pads 304. The third level (LV3) includes a third conductor plate layer 206 and third dummy pads 306. The fourth level (LV4) includes a fourth conductor plate layer 208 and fourth dummy pads 308. The fifth level (LV5) includes a fifth conductor plate layer 210 and fifth dummy pads 310. The first conductor plate layer 202 and the first dummy pads 302 in the first level (LV1) are insulated from the second conductor plate layer 204 and the second dummy pads 304 in the second level (LV2) by a first insulator layer 402. The second conductor plate layer 204 and the second dummy pads 304 in the second level (LV2) are insulated from the third conductor plate layer 206 and the third dummy pads 306 in the third level (LV3) by a second insulator layer 404. The third conductor plate layer 206 and the third dummy pads 306 in the third level (LV3) are insulated from the fourth conductor plate layer 208 and the fourth dummy pads 308 in the fourth level (LV4) by a third insulator layer 406. The fourth conductor plate layer 208 and the fourth dummy pads 308 in the fourth level (LV4) are insulated from the fifth conductor plate layer 210 and the fifth dummy pads 310 in the fifth level (LV5) by a fourth insulator layer 408.

The integrated MIM structure 250 in FIG. 5 also includes a first region 10 and a second region 20. The first region 10 and the second region 20 overlap at a third region 15. FIG. 5 illustrates four contact vias—a first contact via 212, a second contact via 214, a third contact via 216, and a fourth contact via 218. The first contact via 212 is not electrically coupled to any of the conductor plate layers in the integrated MIM structure 250. As shown in FIG. 5, the first contact via 212 extends vertically (along the Z direction) through a first dummy pad 302, a second dummy pad 304, a third dummy pad 306, a fourth dummy pad 308, and a fifth dummy pad 310. As described above, each of these dummy pads is electrically insulated from the conductor plate layer at the same level. The first contact via 212 is insulated from any of the first conductor plate layer 202, the second conductor plate layer 204, the third conductor plate layer 206, the fourth conductor plate layer 208, and the fifth conductor plate layer 210. In other words, the first contact via 212 physically passes through the integrated MIM structure 250 without being electrically coupled to any of the conductor plate layers therein. Through the interconnect structure and RDL, the first contact via 212 is coupled to a source/drain of the first logic transistor 103 that is not connected to an MIM capacitor by design.

Referring still to FIG. 5, the second contact via 214 extends through the first region 10 and is electrically coupled to a first subset of the conductor plate layers. In the depicted embodiment, the first subset includes the fourth conductor plate layer 208. To balance the etch loading, the second contact via 214 additionally extends through four dummy pads—a first dummy pad 302, a second dummy pad 304, a third dummy pad 306, and a fifth dummy pad 310. A fourth contact via 218 extends through the second region 20 and is electrically coupled to a second subset of conductor plate layers. In the depicted embodiment, the second subset includes the second conductor plate layer 204. To balance the etch loading, the fourth contact via 218 also extends through 4 dummy pads—a first dummy pad 302, a third dummy pad 306, a fourth dummy pad 308, and a fifth dummy pad 310. A third contact via 216 extends through the third region 15 and is electrically coupled to a third subset of the conductor plate layers. In the depicted embodiment, the third subset includes the first conductor plate layer 202, the third conductor plate layer 206, and the fifth conductor plate layer 210. To balance the etch loading, the third contact via 216 extends through two dummy pads—a second dummy pad 304 and a fourth dummy pad 308.

The first subset of the conductor plate layers is capacitively coupled to at least one of the third subset of conductor plate layer. In the depicted embodiment, due to vertical areal overlapping, the fourth conductor plate layer 208 (in the first subset) is capacitively coupled to the fifth conductor plate layer 210 (in the third subset) and the third conductor plate layer 206 (in the third subset). Through the interconnect structure and the RDL, the second contact via 214 is electrically coupled to a source/drain of the second logic transistor 104 and the third contact via 216 is electrically coupled to a ground voltage (G). This way, the first region 10 functions as a logic MIM capacitor, with the second contact via 214 serving as a high voltage contact via and the third contact via 216 serving as a ground via. The capacitance between the second contact via 214 and the third contact via 216 is defined by the capacitance between the first subset and the third subset of the conductor plate layers.

The second subset of the conductor plate layers is capacitively coupled to at least one of the third subset of conductor plate layer. In the depicted embodiment, due to vertical areal overlapping, the second conductor plate layer 204 (in the second subset) is capacitively coupled to the first conductor plate layer 202 (in the third subset) and the third conductor plate layer 206 (in the third subset). Through the interconnect structure and the RDL, the fourth contact via 218 is electrically coupled to a source/drain of the I/O transistor 106 and the third contact via 216 is electrically coupled to a ground voltage (G). This way, the second region 20 functions as an I/O MIM capacitor, with the fourth contact via 218 serving as a high voltage contact via and the third contact via 216 serving as a ground via. The capacitance between the fourth contact via 218 and the third contact via 216 is defined by the capacitance between the second subset and the third subset of the conductor plate layers. It is noted that while each of the first subset and the second subset is capacitively coupled to the third subset as described above, the first subset is different from the second subset or the third subset. The second subset is different from the third subset. It can be seen that at least three conductor plate layers are needed in order to have three distinctive subsets.

With the second contact via 214 coupled to the second logic transistor 104, the first region 10 functions as a logic MIM region 10 or a logic MIM capacitor 10. With the fourth contact via 218 coupled to the I/O transistor 106, the second region 20 functions as an I/O MIM region 20 or an I/O MIM capacitor 20. The logic MIM capacitor 10 and the I/O MIM capacitor 20 share the same ground via 216. Although the logic MIM capacitor 10 and the I/O MIM capacitor 20 share the same ground voltage, they may have different operating voltages. For example, the logic MIM capacitor 10 may have an operating voltage between about 0.5 volts and about 1.5 volts and the I/O MIM capacitor 20 may have an operating voltage between about 1.8 volts and about 4.0 volts. A capacitance of the logic MIM capacitor 10 is different from a capacitance of the I/O MIM capacitor 20.

Reference is made to the integrated MIM structure 250 in FIG. 5. In order to accommodate different operating voltages, the first insulation layer 402 and the second insulation layer 404 that affect the capacitance of the I/O MIM capacitor 20 may be different from the third and fourth insulation layers 406 and 408 that affect the capacitance of the logic MIM capacitor 10 in terms of material and thickness. Generally speaking, the I/O MIM capacitor 20 operates at a higher voltage that requires either a greater thickness or a material of higher dielectric constant. In some embodiments, a thickness of each of the first insulation layer 402 and the second insulation layer 404 may be about 2-4 times of a thickness of each of the third insulation layer 406 and the fourth insulation layer 408. In some other embodiments, a dielectric constant of the first insulation layer 402 and the second insulation layer 404 may be greater than a dielectric constant of the other insulation layers. In one example, the first insulation layer 402 and the second insulation layer 404 include hafnium oxide while the other insulation layers (i.e., 406, and 408) include aluminum oxide or hafnium aluminum oxide. In another example, the first insulation layer 402 and the second insulation layer 404 include hafnium zirconium oxide or zirconium oxide while the other insulation layers (i.e., 406, and 408) include hafnium oxide or hafnium aluminum oxide.

Figure 6:
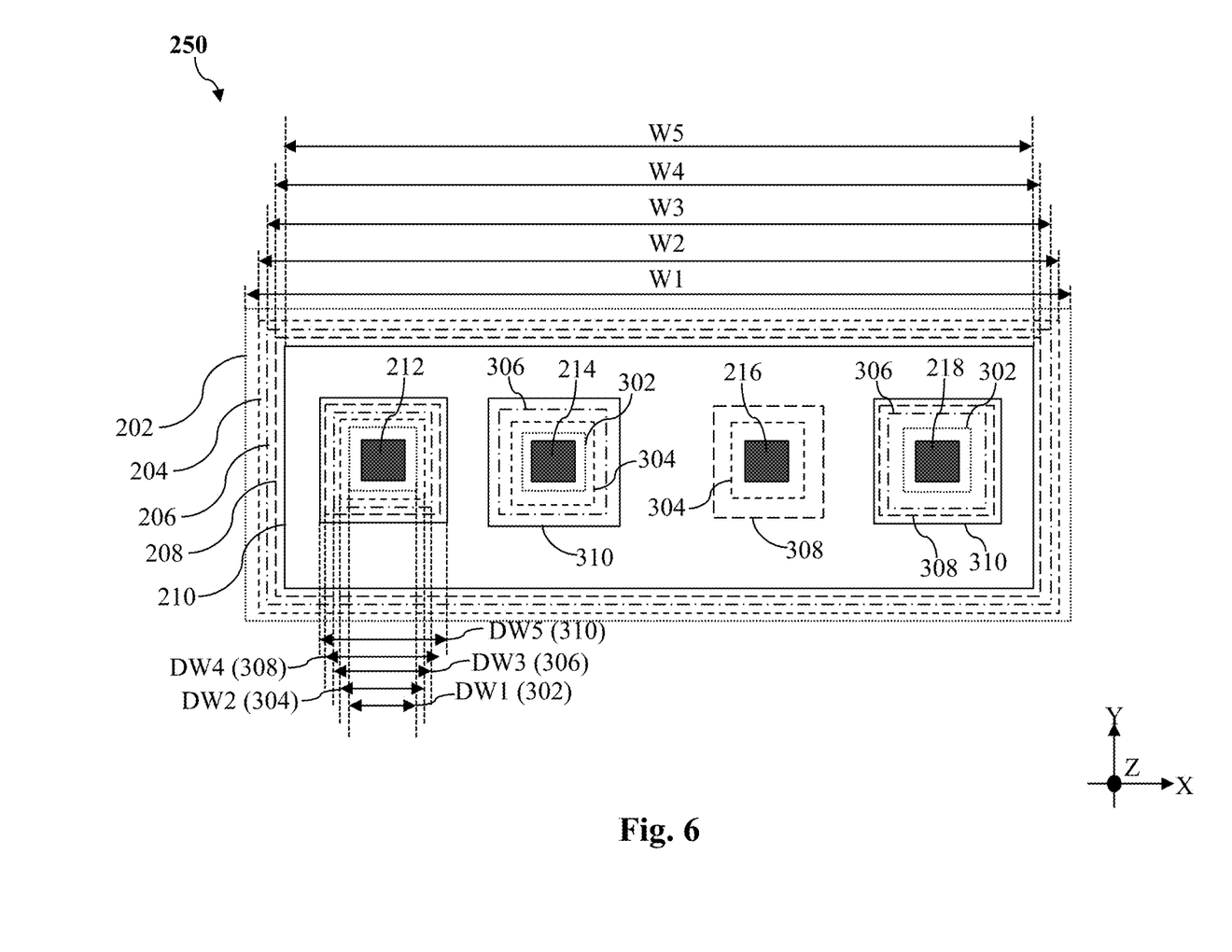
FIGS. 6-8 are schematic top views of the device structure in FIG. 5, according to various aspects of the present disclosure.
Figure 7:
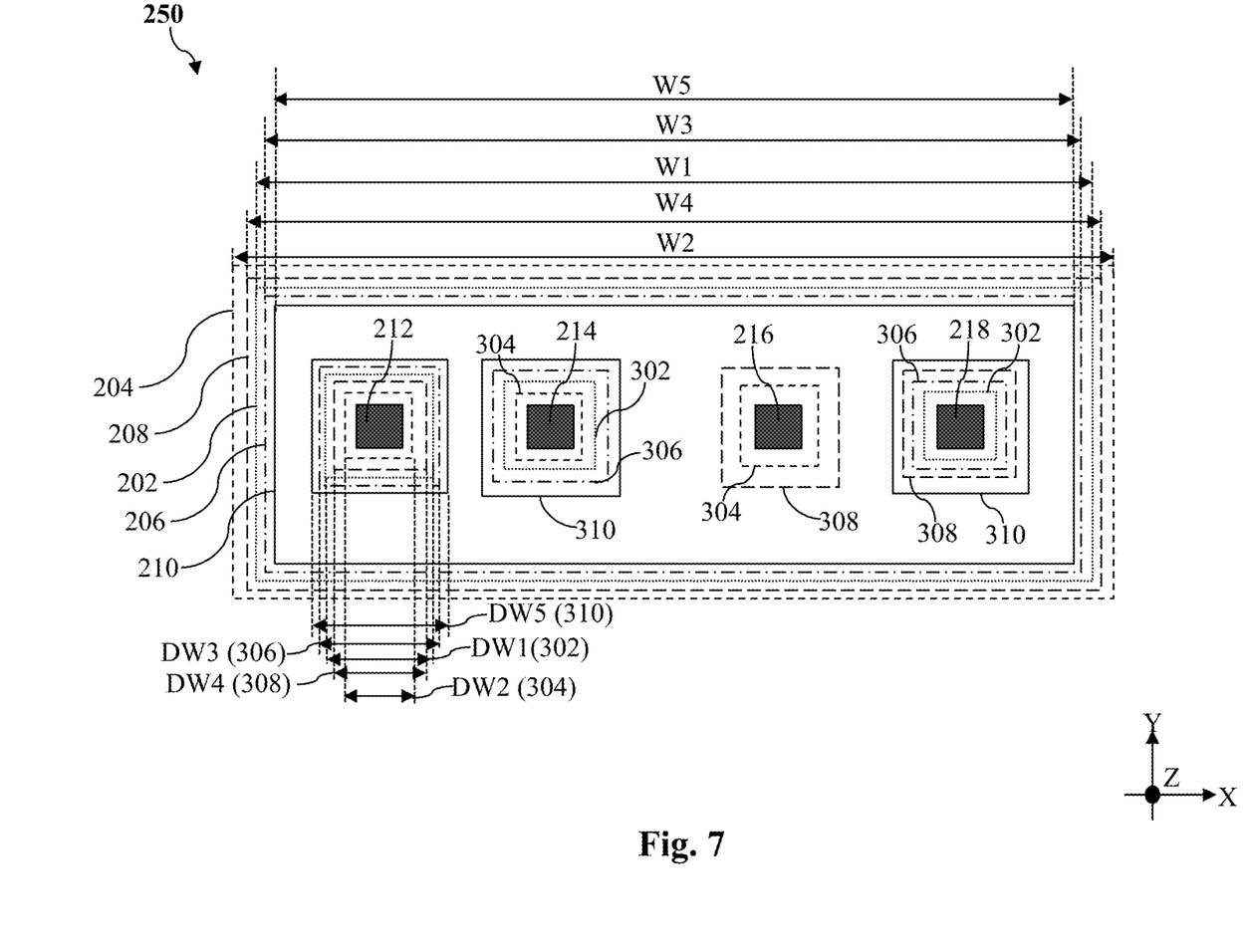
Figure 8:
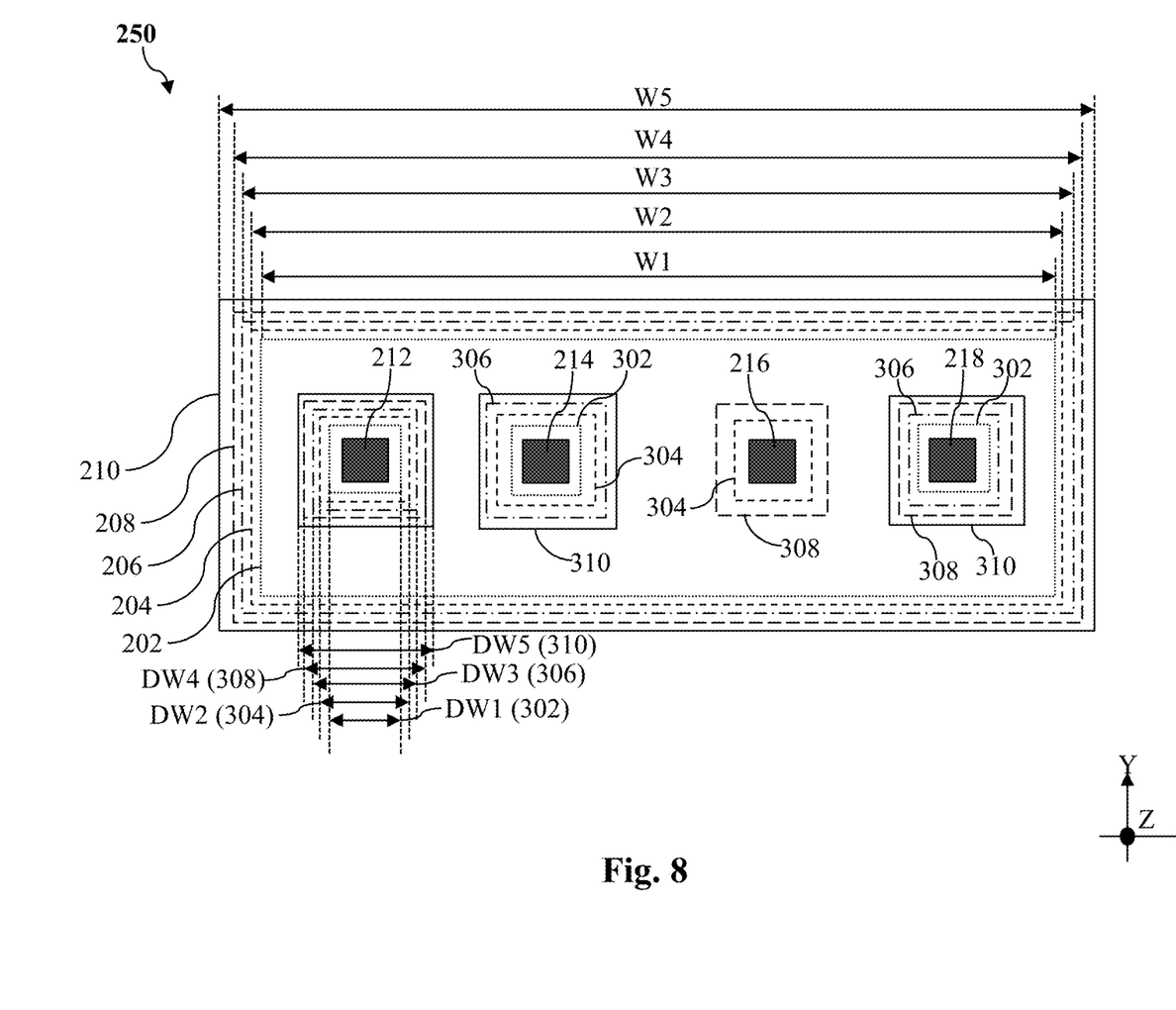

The plurality of the conductor plate layers in FIG. 5 may be stacked according to different conventions. FIGS. 6-8 illustrate schematic top views of the integrated MIM structure 250 shown in FIG. 5. FIG. 6 illustrates embodiments where the conductor plate layers are stacked according to a wide-bottom-narrow-top (BT) convention. FIG. 7 illustrates embodiments where the conductor plate layers are stacked according to an even-number-plate-enclosure (EE) convention. FIG. 8 illustrates embodiments where the conductor plate layers are stacked according to an wide-top-narrow-bottom (TB) convention. To avoid multiplicity of reference numerals, a first dummy pad 302 refers to dummy pad in the first level LV1 (shown in FIG. 5), a second dummy pad 304 refers to dummy pad in the second level LV2 (shown in FIG. 5), a third dummy pad 306 refers to dummy pad in the third level LV3 (shown in FIG. 5), a fourth dummy pad 308 refers to dummy pad in the fourth level LV4 (shown in FIG. 5), a fifth dummy pad 310 refers to dummy pad in the fifth level LV5 (shown in FIG. 5). Although the various contact vias may extend through different dummy pads in the same level, those dummy pads may not be separately named. For example, the first contact via 212 extends through a first dummy pad 302 and the second contact via 214 also extends through a first dummy pad 302. Although these two first dummy pads 302 are separate and different, they may be referred to as a first dummy pad 302 with respect to each of the contact via. None of the illustrated embodiments includes a dummy pad that is extended through by more than one contact via.

Referring to FIG. 6, along the X-Y plane, the first conductor plate layer 202 is larger than the second conductor plate layer 204, the second conductor plate layer 204 is larger than the third conductor plate layer 206, the third conductor plate layer 206 is larger than the fourth conductor plate layer 208, and the fourth conductor plate layer 208 is greater than the fifth conductor plate layer 210. Widths along the X direction may serve as proxies of the areas along the X-Y plane. As shown in FIG. 6, a first width W1 of the first conductor plate layer 202 is greater than a second width W2 of the second conductor plate layer 204, the second width W2 of the second conductor plate layer 204 is greater than a third width W3 of the third conductor plate layer 206, the third width W3 of the third conductor plate layer 206 is greater than a fourth width W4 of the fourth conductor plate layer 208, and the fourth width W4 of the fourth conductor plate layer 208 is greater than a fifth width W5 of the fifth conductor plate layer 210. In some embodiment represented in FIG. 6, the BT convention in the conductor plate layers may result in a TB convention for the dummy pads due to the minimum spacing requirement between an inner edge of an opening and an outer edge of the dummy pad. The largest first width W1 of a first dummy pad 302 comes hand in hand with the smallest first dummy width DW1. The smallest fifth width W5 of a fifth conductor plate layer 210 is accompanied by the largest fifth dummy width DW5. It follows that a fourth dummy width DW4 of a fourth dummy pad 308 is greater than a third dummy width DW3 of a third dummy pad 306 and the third dummy width DW3 is greater than a second dummy width DW2 of a second dummy pad 304.

Referring to FIG. 6, the second contact via 214 vertically extends through a fifth dummy pad 310, the fourth conductor plate layer 208, a third dummy pad 306, a second dummy pad 304, and a first dummy pad 302. The fifth dummy pad 310 is larger than the third dummy pad 306, the third dummy pad 306 is larger than the second dummy pad 304, and the second dummy pad 304 is larger than the first dummy pad 302. The third contact via 216 vertically extends through the fifth conductor plate layer 210, a fourth dummy pad 308, the third conductor plate layer 206, a second dummy pad 304, and the first conductor plate layer 202. The fourth dummy pad 308 is larger than the second dummy pad 304. The fourth contact via 218 vertically extends through a fifth dummy pad 310, a fourth dummy pad 308, a third dummy pad 306, the second conductor plate layer 204, and a first dummy pad 302. The fifth dummy pad 310 is larger than the fourth dummy pad 308, the fourth dummy pad 308 is larger than the third dummy pad 306, and the third dummy pad 306 is larger than the first dummy pad 302.

FIG. 7 illustrates embodiments where the conductor plate layers are stacked according to an even-number-plate-enclosure (EE) convention. As shown therein, along the X-Y plane, the second conductor plate layer 204 is larger than and encloses the first conductor plate layer 202 and the fourth conductor plate layer 208 is larger than and encloses the third the fourth conductor plate layer 208. The third conductor plate layer 206 is also smaller than the fourth conductor plate layer 208. Out of the odd-numbered conductor plate layers, the first conductor plate layer 202 is the largest and the fifth conductor plate layer 210 is the smallest. Widths along the X direction may serve as proxies of the areas along the X-Y plane. As shown in FIG. 7, the second width W2 of the second conductor plate layer 204 is greater than the fourth width W4 of the fourth conductor plate layer 208, the fourth width W4 is greater than the first width W1 of the first conductor plate layer 202, the first width W1 is greater than the third width W3 of the third conductor plate layer 206, and the third width W3 is greater than a fifth width W5 of the fifth conductor plate layer 210. In some embodiment represented in FIG. 7, the EE convention in the conductor plate layers may result in an odd-number-pad-enclosure convention for the dummy pads due to the minimum spacing requirement between an inner edge of an opening and an outer edge of the dummy pad. The largest second width W2 of the second conductor plate layer 204 comes hand in hand with the smallest second dummy width DW2. The smallest fifth width W5 of the fifth conductor plate layer 210 is accompanied by the largest fifth dummy width DW5. It can be seen that the fifth dummy pad 310 is larger than and encloses the fourth dummy pad 308 and the third dummy pad 306 is larger than and encloses the second dummy pad 304.

Referring to FIG. 7, the second contact via 214 vertically extends through a fifth dummy pad 310, the fourth conductor plate layer 208, a third dummy pad 306, a second dummy pad 304, and a first dummy pad 302. The fifth dummy pad 310 is larger than the third dummy pad 306, the third dummy pad 306 is larger than the second dummy pad 304, and the first dummy pad 302 is larger than the second dummy pad 304. The third contact via 216 vertically extends through the fifth conductor plate layer 210, a fourth dummy pad 308, the third conductor plate layer 206, a second dummy pad 304, and the first conductor plate layer 202. The fourth dummy pad 308 is larger than the second dummy pad 304. The fourth contact via 218 vertically extends through a fifth dummy pad 310, a fourth dummy pad 308, a third dummy pad 306, the second conductor plate layer 204, and a first dummy pad 302. The fifth dummy pad 310 is larger than the fourth dummy pad 308 and the third dummy pad 306 is larger than the first dummy pad 302.

FIG. 8 illustrates embodiments where the conductor plate layers are stacked according to an wide-top-narrow-bottom (TB) convention. As shown in FIG. 8, along the X-Y plane, the fifth conductor plate layer 210 is larger than the fourth conductor plate layer 208, the fourth conductor plate layer 208 is larger than the third conductor plate layer 206, the third conductor plate layer 206 is larger than the second conductor plate layer 204, and the second conductor plate layer 204 is greater than the first conductor plate layer 202. Widths along the X direction may serve as proxies of the areas along the X-Y plane. As shown in FIG. 8, a fifth width W5 of the fifth conductor plate layer 210 is greater than a fourth width W4 of the fourth conductor plate layer 208, the fourth width W4 is greater than a third width W3 of the third conductor plate layer 206, the third width W3 is greater than a second width W2 of the second conductor plate layer 204, and the second width W2 is greater than a first width W1 of the first conductor plate layer 202. In some embodiment represented in FIG. 8, the TB convention in the conductor plate layers may result in a TB convention for the dummy pads due to the cascade shape. The largest fifth width W5 comes hand in hand with the largest fifth dummy width DW5. The smallest first width W1 is accompanied by the smallest first dummy width DW1. It follows that a fourth dummy width DW4 of a fourth dummy pad 308 is greater than a third dummy width DW3 of a third dummy pad 306 and the third dummy width DW3 is greater than a second dummy width DW2 of a second dummy pad 304.

Referring to FIG. 8, the second contact via 214 vertically extends through a fifth dummy pad 310, the fourth conductor plate layer 208, a third dummy pad 306, a second dummy pad 304, and a first dummy pad 302. The fifth dummy pad 310 is larger than the third dummy pad 306, the third dummy pad 306 is larger than the second dummy pad 304, and the second dummy pad 304 is larger than the first dummy pad 302. The third contact via 216 vertically extends through the fifth conductor plate layer 210, a fourth dummy pad 308, the third conductor plate layer 206, a second dummy pad 304, and the first conductor plate layer 202. The fourth dummy pad 308 is larger than the second dummy pad 304. The fourth contact via 218 vertically extends through a fifth dummy pad 310, a fourth dummy pad 308, a third dummy pad 306, the second conductor plate layer 204, and a first dummy pad 302. The fifth dummy pad 310 is larger than the fourth dummy pad 308, the fourth dummy pad 308 is larger than the third dummy pad 306, and the third dummy pad 306 is larger than the first dummy pad 302.

One aspect of the present disclosure involves a device structure. The device structure includes a metal-insulator-metal (MIM) stack including a plurality of conductor plate layers interleaved by a plurality of insulator layers, the MIM stack including a first region and a second region, the first region and the second region overlapping in a third region, a first via passing through the first region and electrically coupled to a first subset of the plurality of conductor plate layers, a second via passing through the second region and electrically coupled to a second subset of the plurality of conductor plate layers, and a ground via passing through the third region and electrically coupled to a third subset of the plurality of conductor plate layers. At least one of the third subset of the plurality of conductor plate layers vertically overlaps with at least one of the first subset of the plurality of the conductor plate layers and at least one of the second subset of the plurality of the conductor plate layers.

In some embodiments, the first subset, the second subset and the third subset are different from one another. In some implementations, the first via is coupled to a first voltage and the second via is coupled to a second voltage greater than the first voltage, and the ground via is coupled to a ground voltage. In some instances, the plurality of conductor plate layers include titanium nitride, tantalum nitride, titanium, or tantalum. In some embodiments, the plurality of insulator layers include zirconium oxide, hafnium oxide, zirconium aluminum oxide, hafnium aluminum oxide, or aluminum oxide. In some embodiments, the plurality of conductor plate layers include at least three conductor plate layers. In some instances, the plurality of conductor plate layers include a first conductor plate layer, a second conductor plate layer disposed over the first conductor plate layer, a third conductor plate layer disposed over the second conductor plate layer, a fourth conductor plate layer disposed over the third conductor plate layer, and a fifth conductor plate layer disposed over the fourth conductor plate layer. In some implementations, the first subset includes the third conductor plate layer and the fifth conductor plate layer, the second subset includes the first conductor plate layer, and the third subset includes the second conductor plate layer and the fourth conductor plate layer. In some instances, the first subset includes the fourth conductor plate layer, the second subset includes the second conductor plate layer, and the third subset includes the first conductor plate layer, the third conductor plate layer and the fifth conductor plate layer.

Another aspect of the present disclosure involves a device structure. The device structure includes a capacitor stack having a plurality of conductor plate layers interleaved by a plurality of insulator layers, the capacitor stack including a first region and a second region, the first region and the second region overlapping in a third region, a first via passing through the first region, a second via passing through the second region, and a ground via passing through the third region. The first via is capacitively coupled to the ground via at a first capacitance and the second via is capacitively coupled to the ground via at a second capacitance different from the first capacitance.

In some embodiments, the ground via is disposed between the first via and the second via. In some implementations, the first via extends through and is electrically coupled to a first subset of the plurality of conductor plate layers, the second via extends through and is electrically coupled to a second subset of the plurality of conductor plate layers, the ground via extends through and is electrically coupled to a third subset of the plurality of conductor plate layers, and the first subset, the second subset and the third subset are different from one another.

In some embodiments, the plurality of conductor plate layers include a first conductor plate layer, a second conductor plate layer disposed over the first conductor plate layer, a third conductor plate layer disposed over the second conductor plate layer, a fourth conductor plate layer disposed over the third conductor plate layer, and a fifth conductor plate layer disposed over the fourth conductor plate layer. In some implementations, the first subset includes the third conductor plate layer and the fifth conductor plate layer, the second subset includes the first conductor plate layer, and the third subset includes second conductor plate layer and the fourth conductor plate layer. In some instances, the plurality of insulator layers include a first insulator layer disposed between the first conductor plate layer and the second conductor plate layer, a second insulator layer disposed between the second conductor plate layer and the third conductor plate layer, a third insulator layer disposed between the third conductor plate layer and the fourth conductor plate layer, and a fourth insulator layer disposed between the fourth conductor plate layer and the fifth conductor plate layer. In some embodiments, the first insulator layer includes a first composition, the second insulator layer, the third insulator layer, and the fourth insulator layer include a second composition different from the first composition. In some embodiments, a dielectric constant of the first composition is greater than a dielectric constant of the second composition. In some embodiments, the first insulator layer includes a first thickness and the second insulator layer, the third insulator layer, and the fourth insulator layer include a second thickness different from the first thickness.

Still another aspect of the present disclosure involves a structure. The structure includes a first transistor and a second transistor, a metal-insulator-metal (MIM) stack disposed over the first transistor and the second transistor and including a first region and a second region, the first region and the second region overlapping in a third region, a first via passing through the first region and electrically coupled to a source/drain feature of the first transistor, a second via passing through the second region and electrically coupled to a source/drain feature of the second transistor, and a ground via passing through the third region and electrically coupled to a ground potential. The first via is capacitively coupled to the ground via at a first capacitance and the second via is capacitively coupled to the ground via at a second capacitance different from the first capacitance.

In some embodiments, the first transistor is a logic transistor, the second transistor is an input/output (I/O) transistor, and an operating voltage of the I/O transistor is greater than an operating voltage of the logic transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure, comprising:
    a metal-insulator-metal (MIM) stack comprising a plurality of conductor plate layers interleaved by a plurality of insulator layers, the MIM stack including a first region and a second region, the first region and the second region overlapping in a third region;
    a first via passing through the first region and electrically coupled to a first subset of the plurality of conductor plate layers;
    a second via passing through the second region and electrically coupled to a second subset of the plurality of conductor plate layers; and
    a ground via passing through the third region and electrically coupled to a third subset of the plurality of conductor plate layers,
    wherein at least one of the third subset of the plurality of conductor plate layers vertically overlaps with at least one of the first subset of the plurality of the conductor plate layers and at least one of the second subset of the plurality of the conductor plate layers,
    wherein the first subset of the plurality of conductor plate layers is insulated from the second subset of the plurality of conductor plate layers by at least one of the plurality of insulator layers.

2. The device structure of claim 1, wherein the first subset, the second subset and the third subset are different from one another.

3. The device structure of claim 1,
    wherein the first via is coupled to a first voltage,
    wherein the second via is coupled to a second voltage greater than the first voltage,
    wherein the ground via is coupled to a ground voltage.

4. The device structure of claim 1, wherein the plurality of conductor plate layers comprise titanium nitride, tantalum nitride, titanium, or tantalum.

5. The device structure of claim 1, wherein the plurality of insulator layers comprise zirconium oxide, hafnium oxide, zirconium aluminum oxide, hafnium aluminum oxide, or aluminum oxide.

6. The device structure of claim 1, wherein the plurality of conductor plate layers comprise at least three conductor plate layers.

7. The device structure of claim 1, wherein the plurality of conductor plate layers comprise:
    a first conductor plate layer;
    a second conductor plate layer disposed over the first conductor plate layer;
    a third conductor plate layer disposed over the second conductor plate layer;
    a fourth conductor plate layer disposed over the third conductor plate layer; and
    a fifth conductor plate layer disposed over the fourth conductor plate layer.

8. The device structure of claim 7,
    wherein the first subset comprises the third conductor plate layer and the fifth conductor plate layer,
    wherein the second subset comprises the first conductor plate layer,
    wherein the third subset comprises the second conductor plate layer and the fourth conductor plate layer.

9. The device structure of claim 7,
    wherein the first subset comprises the fourth conductor plate layer,
    wherein the second subset comprises the second conductor plate layer,
    wherein the third subset comprises the first conductor plate layer, the third conductor plate layer and the fifth conductor plate layer.

10. A device structure, comprising:
    a capacitor stack, the capacitor stack comprising a plurality of conductor plate layers interleaved by a plurality of insulator layers, the capacitor stack including a first region and a second region, the first region and the second region overlapping in a third region;
    a first via passing through the first region;
    a second via passing through the second region; and
    a ground via passing through the third region,
    wherein the first via is capacitively coupled to the ground via at a first capacitance,
    wherein the second via is capacitively coupled to the ground via at a second capacitance different from the first capacitance.

11. The device structure of claim 10, wherein the ground via is disposed between the first via and the second via.

12. The device structure of claim 10,
    wherein the first via extends through and is electrically coupled to a first subset of the plurality of conductor plate layers,
    wherein the second via extends through and is electrically coupled to a second subset of the plurality of conductor plate layers,
    wherein the ground via extends through and is electrically coupled to a third subset of the plurality of conductor plate layers,
    wherein the first subset, the second subset and the third subset are different from one another.

13. The device structure of claim 12, wherein the plurality of conductor plate layers comprise:
- a first conductor plate layer;
- a second conductor plate layer disposed over the first conductor plate layer;
- a third conductor plate layer disposed over the second conductor plate layer;
- a fourth conductor plate layer disposed over the third conductor plate layer; and
- a fifth conductor plate layer disposed over the fourth conductor plate layer.

14. The device structure of claim 13,
wherein the first subset comprises the third conductor plate layer and the fifth conductor plate layer,
wherein the second subset comprises the first conductor plate layer,
wherein the third subset comprises second conductor plate layer and the fourth conductor plate layer.

15. The device structure of claim 14, wherein the plurality of insulator layers comprise:
- a first insulator layer disposed between the first conductor plate layer and the second conductor plate layer;
- a second insulator layer disposed between the second conductor plate layer and the third conductor plate layer;
- a third insulator layer disposed between the third conductor plate layer and the fourth conductor plate layer; and
- a fourth insulator layer disposed between the fourth conductor plate layer and the fifth conductor plate layer.

16. The device structure of claim 15,
wherein the first insulator layer comprises a first composition,
wherein the second insulator layer, the third insulator layer, and the fourth insulator layer comprise a second composition different from the first composition.

17. The device structure of claim 16, wherein a dielectric constant of the first composition is greater than a dielectric constant of the second composition.

18. The device structure of claim 15,
wherein the first insulator layer comprises a first thickness,
wherein the second insulator layer, the third insulator layer, and the fourth insulator layer comprise a second thickness different from the first thickness.

19. A structure, comprising:
- a first transistor and a second transistor;
- a metal-insulator-metal (MIM) stack disposed over the first transistor and the second transistor, the MIM stack including a first region and a second region, the first region and the second region overlapping in a third region;
- a first via passing through the first region and electrically coupled to a source/drain feature of the first transistor;
- a second via passing through the second region and electrically coupled to a source/drain feature of the second transistor; and
- a ground via passing through the third region and electrically coupled to a ground potential,
wherein the first via is capacitively coupled to the ground via at a first capacitance,
wherein the second via is capacitively coupled to the ground via at a second capacitance different from the first capacitance.

20. The structure of claim 19,
wherein the first transistor is a logic transistor,
wherein the second transistor is an input/output (I/O) transistor,
wherein an operating voltage of the I/O transistor is greater than an operating voltage of the logic transistor.

* * * * *